United States Patent [19]

Hoenig et al.

[11] Patent Number: 4,733,180

[45] Date of Patent: Mar. 22, 1988

[54] APPARATUS FOR MEASURING WEAK MAGNETIC FIELDS HAVING SUPERCONDUCTING CONNECTIONS BETWEEN A SQUID ARRAY AND A GRADIOMETER ARRAY

[75] Inventors: Eckhardt Hoenig; Hanns-Jörg Weisse, both of Erlangen, Fed. Rep. of Germany

[73] Assignee: Siemens Aktiengesellschaft, Munich, Fed. Rep. of Germany

[21] Appl. No.: 854,775

[22] Filed: Apr. 22, 1986

[30] Foreign Application Priority Data

Apr. 26, 1985 [DE] Fed. Rep. of Germany ....... 3515217

[51] Int. Cl.⁴ .................. H03K 3/38; G01R 33/02
[52] U.S. Cl. ..................................... 324/248; 307/306
[58] Field of Search ................ 324/248; 307/306; 335/216; 357/5

[56] References Cited

U.S. PATENT DOCUMENTS 3,631,380 12/1971 Bohn .................................. 339/156

FOREIGN PATENT DOCUMENTS 0111827 12/1983 European Pat. Off. .
1962231 7/1970 Fed. Rep. of Germany .

OTHER PUBLICATIONS

Bondarenko et al., "A Planar Thin Film SQUID" Cryogenics, May 1983, vol. 23, No. 5, pp 263-264.
Rev. Sci. Instrum. 53 (12), Dec. 1982, pp 1815-1845, Physica 107B, (1981), pp. 29-30.
IEEE Trans. on Mag., Vol. Mag 17, No. 1, Jan. 1981, pp. 400-403.
IBM Technical Discl. Bulletin, vol. 25, No. 3B, Aug. 1982, pp. 1701-1702.

Primary Examiner—Reinhard J. Eisenzopf
Assistant Examiner—Walter E. Snow
Attorney, Agent, or Firm—Kenyon & Kenyon

[57] ABSTRACT

Between a SQUID array having contact pads and a gradiometer array there is a multiplicity of superconducting connections. The superconducting connections contain a contact comb which comprises flat, substantially U-shaped, at least partially superconducting spring contacts which are electrically insulated from each other and combined with their flat sides parallel to each other and perpendicularly to the surface of the contact pads to form a packet. One leg of the spring contacts is provided with a projection which is intended as a pressure contact for one of the contact pads of the SQUID array and a further leg is associated with a pressure plate, the force of which is directed parallel to the flat side of the spring contact and perpendicularly to the surface of the contact pads. An adjusting block permits a simple adjustment of the projections on the contact pads of the SQUID array via a projection of a middle leg of the spring contact.

6 Claims, 2 Drawing Figures

APPARATUS FOR MEASURING WEAK MAGNETIC FIELDS HAVING SUPERCONDUCTING CONNECTIONS BETWEEN A SQUID ARRAY AND A GRADIOMETER ARRAY

BACKGROUND OF THE INVENTION

The present invention relates to apparatus for measuring weak magnetic fields, the apparatus having a multiplicity of superconducting connections between a SQUID array which is arranged on a substrate provided with contact pads, and a gradiometer array.

It is known to use superconducting quantum interference elements which are known by the designation "SQUID" (Superconducting Quantum Interference Device) for measuring weak variable magnetic fields, for instance, in a field intensity range below $10^{-10}$T, and in particular, below $10^{-12}$T. These elements are preferably used in medical technology and especially in magnetocardiography, where magnetic fields of the heart in the order of about 50 pT are measured as well as in magnetoencephalography, where magnetic fields of the brain in the order of about 0.1 pT are measured. The apparatus essentially comprises a detector coil, which, together with a coupling coil, forms a flux transformer which is arranged together with the SQUID within a Dewar vessel in liquid helium. Electronic circuitry is associated with the SQUID for determining and processing signals. Since the magnetic fields to be measured are up to six orders of magnitude smaller than external interference fields, appropriate shielding is required. Because of its greater sensitivity, a DC-SQUID (direct-current SQUID) can be used which contains two Josephson junctions. The detector coil, together with an associated compensation coil, forms a so-called gradiometer. With gradiometers of the zero$^{th}$, first or higher order, the biomagnetic near field which is still non-uniform in the gradiometer range, can be determined selectively (Rev. Sci. Instrum. 53 (12)), December 1982, pages 1815 to 1845).

In order to obtain a three-dimensional field distribution, measurements must be performed successively in time at different locations of the region to be examined. The difficulty then, however, arises that the coherence of the field data is no longer assured over the required measuring time and in addition, clinically intolerable measuring times result. One has therfefore gone to measuring with devices which contain several parallel measuring channels (Physica 107B (1981), pages 29 and 30, North Holland Publishing Company).

In an embodiment of apparatus of the kind mentioned above with a magnetometer or gradiometer array which contains a larger number, for instance, at least 10 and preferably more than 30 gradiometer coils, a multiplicity of conductors must therefore also be connected to the associated coupling coil of a corresponding SQUID array.

In the known embodiment of a DC-SQUID, the SQUID together with its coupling coil can be designed as a thin-film transformer, in which the flat spiral-shaped turns of the coupling coil are arranged above the SQUID. With this design, good magnetic coupling is obtained (IEEE Transactions on Magnetics, vol. MAG-17, no. 1, January 1981, pages 400 to 403).

SUMMARY OF THE INVENTION

It is an object of the present invention to provide an apparatus for measuring weak magnetic fields, in which a multiplicity of coupling coils of the SQUID array are connected to a corresponding number of magnetometer or gradiometer coils in a limited space.

It is furthermore an object of the present invention to provide connections between coupling coils of a SQUID array and magnetometer or gradiometer coils in an apparatus for measuring weak magnetic fields which connections can be reproduced, which are reliable and which have low inductivity.

The above and other objects of the invention are achieved by an apparatus for measuring weak magnetic fields having a multiplicity of superconducting connections between a SQUID array arranged on a substrate provided with contact pads, and a gradiometer or magnetometer array, the superconducting connections comprising contact comb means comprising a plurality of flat substantially U-shaped spring contact means which are at least partially superconducting and which are electrically insulated from each other and perpendicularly to the surface of the contact pads, said contact means forming a packet, the spring contact means having a first leg, a second middle leg and a third leg, the first leg of the spring contact means being provided with a first projection comprising a pressure contact for one of the contact pads, the middle leg of the spring contact means being provided with a second projection extending in the same direction as the first projection and being supported in a slot of an adjusting block means of electrically insulating material, the slot extending perpendicularly to the flat sides of the spring contact means and parallel to the plane of the contact pads, further pressure plate means being provided for applying a force directed parallel to the flat sides of the spring contact means and perpendicularly to the surface of the contact pads against the third leg of the spring contact means.

The contact springs of superconductive material, preferably niobium, thus formed, are put together to form a packet and are guided in the slot which may preferably be a V-slot of the adjusting block means. The individual springs are insulated from each other by cementing thereon an electrically insulating foil, preferably a plastic foil or an electrically insulating spacer. Their thickness including the insulation determines the spacing of the pressure contacts which is determined by the size and shape of the contact pads on the substrate. By a staggered arrangement of adjacent contact pads, the packing density of the contact comb can be increased accordingly.

In a similar manner, spring contacts adjacent in the contact comb can be provided alternatingly with contact tabs of different lengths at their ends facing the gradiometer leads. Furthermore, the contact tabs for the superconductor can be offset in height so that room is made for the superconducting leads between adjacent contact springs.

In one embodiment of the apparatus, a magnetic shield of a superconducting base body can be provided underneath the spring contacts, on which a semiconducting substrate is arranged and which extends also under the adjusting block means. This shielding can preferably be designed at the same time as a ground plane.

In one embodiment of the apparatus having a gradiometer or magnetometer array, the coils of which comprise superconducting thin-film conductor runs on foil carriers, a superconducting transition connection can preferably be provided between the spring contacts and the thin-film conductor runs which makes possible a connection of a superconductor to the spring contact as well as a connection of the superconductor to the thin-film conductor run.

BRIEF DESCRIPTION OF THE DRAWINGS

The invention will be described in greater detail in the following description with reference to the drawings, in which.

DETAILED DESCRIPTION

Figure 1:
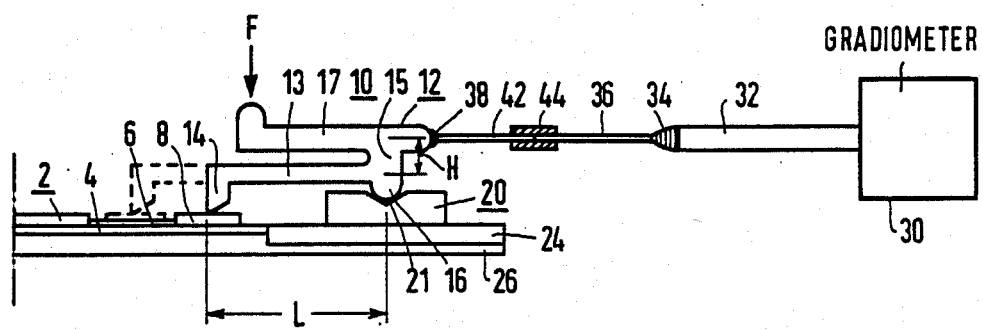
FIG. 1 shows schematically an individual line connection between a SQUID array and a gradiometer array.

With reference now to the drawings, in the embodiment of apparatus for measuring weak magnetic fields according to FIG. 1, a large number, preferably at least 10 SQUIDS, of which only one is indicated in the figure and is designated with 2, together with their coupling coils and optionally also their modulation coils, is to be arranged as a thin-film structure on a substrate 4. The substrate can preferably comprise a semiconductor material, especially of silicon. The electric leads of the SQUIDs 2 as well as of their associated coupling coils are each connected via a superconducting connecting conductor 6 to a large area superconducting terminal contact, a so-called contact pad 8 which may comprise, for instance, niobium. A spring contact 12 of a contact comb 10 is associated with this contact pad 8. The substantially U-shaped spring contact 12 contains a first or lower leg 13 which is provided at its free end with a projection 14, the end of which is provided as a pressure contact for the contact pad 8. The second or middle leg 15 of the spring contact 12 is provided with a projection 16 in the same direction as the projection 14 and is supported in a slot 21 extending perpendicularly to the flat sides of the spring contact 12 and parallel to the plane of the contact pad 8, of an adjusting block 20 of electrically insulating material. The end of the third or upper leg 17 of the spring contact 12 is subjected to a force F parallel to the flat sides of the spring contact 12 and perpendicularly to the surface of the contact pad 8 and is indicated in the figure by an arrow. The adjusting block 20 is arranged on a printed circuit board 24. At the lower flat side of the printed circuit board 24, shielding 26 of superconducting material, for instance, niobium, is provided. The substrate 4 is inserted into a cutout, not specifically designated, of the printed circuit board 24.

In one embodiment of the apparatus for measuring weak magnetic fields with a gradiometer or magnetometer array 30, the coils of which comprise superconducting or superconductingly coated thin-film conductor runs on foil carriers, it is difficult to connect the superconducting spring contacts 12 which generally comprise niobium, to the thin-film conductor runs 32. These thin-film conductor runs can preferably be applied to both flat sides of a carrier of plastic, preferably polyimide (Capton) or fiber-glass-reinforced plastic (GFK) such as epoxy resin. The preparation of such conductor runs can be in accordance with known structuring methods, for instance, photoresist etching techniques of metal-clad plastic carriers. The metallic conductor runs with a width of, for instance, 50 to 300 $\mu$m and a thickness of, say, 10 to 50 $\mu$m can comprise, for instance, manganin, copper or bronze. These conductor strips are given a superconducting surface layer which can preferably comprise a lead/tin solder. This conductor run 32 can be connected by means of a solder joint 34 to a metal wire 36 which can for instance, comprise bronze and is provided with a superconducting coating which can preferably comprise lead/tin. The spring contact 12 is then provided by means of a welding connection 38 with a superconducting wire 42 which may, for instance, comprise niobium and can be connected to the metal wire 36 by means of a crimp contact. The crimp contact is made by means of a slipped-on sleeve 44 of superconducting material, for instance, niobium.

Figure 2:
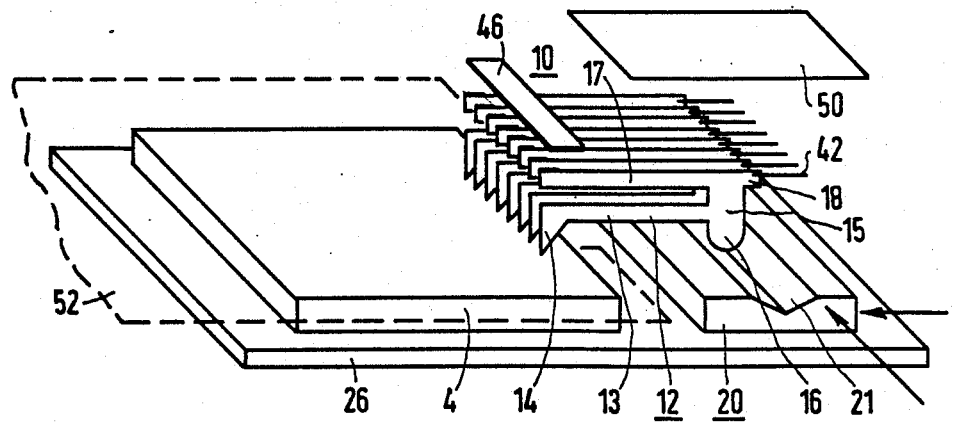
FIG. 2 shows schematically a perspective view of an embodiment of a contact comb.

In the embodiment of a contact comb 10 according to FIG. 2, a larger number of spring contacts 12, of which only 8 are shown in the figure and which are provided with insulation, not shown in the figure, are lined up with their flat sides in such a manner that they form a spring packet (or stack). The projections 14 of their lower legs 13 each touch a contact pad, not shown in the figure, on the surface of the substrate 4, which is arranged on the shielding 26. The projections 16 of the middle legs 15 may have, for instance, semicircular shape. In the embodiment shown, the slot of the adjusting block 20 is provided with a triangular profile. The adjusting block 20 is movable on the printed circuit board 24 which is not shown in FIG. 2 for the sake of simplification in the direction parallel to the legs 13 and 17 of the spring contact 12 as well as perpendicularly to the flat sides of the spring contact, as is indicated by corresponding arrows. It is fixed with the contact comb 10 by an adjusting device as soon as the projections 14 of the spring contacts 12 rest on the contact pads assigned to them; they are not shown in the figure for the sake of simplification. In this position a pressure plate 46 is arranged above the upper legs 17, the screw connection of which is not shown in the figure and the force of which determines the contact pressure of the spring contacts 12 on the contact pads 8.

The spring contacts 12 can be provided at their middle leg 15 with connecting tabs 18 of preferably different lengths, to which the surrounding layer 42 can be welded. Due to the different lengths there is room for the respective welded joints.

The length L of the lower legs 13 of the spring contacts 12 may be, for instance, 15 mm and the mean height H of their middle leg can be, for instance, about 3 mm. Their thickness d including their electrically insulating overlay can be, for instance, 0.5 mm. It is determined by the width of the contact pads 8 on the substrate 4. The width of the spring comb 10 can be decreased by staggering the contact pads 8 on the substrate 4 relative to each other. In this embodiment, the contact comb 10 is given spring contacts 12 of alternatingly different length of its lower legs 13 as is indicated dashed in FIG. 1. In this embodiment, a larger number of contact pads 8 can be connected, with a substrate 4 of the same width, to the thin-film conductor run 32 of one of the coils of the gradiometer 30 via respective spring contacts 12.

The spring contacts 12 of the contact comb 10 can advantageously be provided with an additional shielding 50 which can be realized, in one embodiment of the apparatus, at the same time as a ground plane. In this embodiment it can serve at the same time as a common lead for the return line of the coils of the gradiometer 30. It can furthermore be provided only as a collecting contact for these returns and be connected via one of the contact springs 12 to a contact pad 8 of the substrate 4 which can then be tied to ground. The additional shielding 50 can advantageously be fastened with the pressure plate 46 on the contact comb 10, the screw connection of which is not shown in the figure for the sake of simplification.

In one embodiment of the arrangement, a further shield 52 can be provided for the SQUIDs with their connecting conductors and contact pads, which is arranged above the substrate 4 as is indicated dashed in the figure.

In the foregoing specification, the invention has been described with reference to specific exemplary embodiments thereof. It will, however, be evident that various modifications and changes may be made thereunto without departing from the broader spirit and scope of the invention as set forth in the appended claims. The specification and drawings are, accordingly, to be regarded in an illustrative rather than a restrictive sense.

What is claimed is:

1. Apparatus for measuring weak magnetic fields having a multiplicity of superconducting connections between a SQUID array arranged on a substrate provided with contact pads, and a gradiometer array, said superconducting connections comprising contact comb means comprising a plurality of flat substantially U-shaped spring contact means which are at least partially ssupeconducting and which are electrically insulated from each other and disposed with their flat sides parallel to each other and perpendicularly to the surface of the contact pads, said spring contact means forming a packet, said spring contact means having a first leg, a second middle leg and a third leg, the first leg of the spring contact means being provided with a first projection comprising a pressure contact for one of the contact pads, the middle leg of the spring contact means being provided with a second projection extending in the same direction as the first projection, said second projection being supported in a slot of an adjusting block means of electrically insulating material, said slot extending perpendicularly to the flat sides of the spring contact means and parallel to the plane of the contact pads, pressure plate means being provided for applying a force directed parallel to the flat sides of the spring contact means and perpendicularly to the surface of the contact pads against the third leg of said spring contact means.

2. The apparatus recited in claim 1 wherein the spring contact means have first legs of alternatingly different lengths, the first projections of which are staggered relative to each other in the plane of their flat sides and parallel to the surface of the contact pads.

3. The apparatus recited in claim 1, wherein a magnetic shielding of a superconducting base body is provided below the spring contact means, on which the substrate is arranged and which also extends underneath the adjusting block means.

4. The apparatus recited in claim 1, wherein an additional magnetic shield means is provided above the spring contact means of a superconducting material which is coupled to the pressure plate means.

5. The apparatus recited in claim 4, wherein the additional magnetic means is provided as a ground plane for part of the superconducting connections which are connected jointly to one of the contact pads via one of the spring contact means.

6. The apparatus recited in claim 1 wherein the coils of the gradiometer array comprise superconducting thin-film conductor runs on foil carriers, a superconducting transition connection being provided between each of the spring contact means and the thin-film conductor runs, comprising a superconducting wire connected by spot welding to the spring contact means, and by a crimp contact to a conductor of normal-conducting material having a superconducting coating, said conductor being connected to the thin-film conductor run by means of a solder joint.

* * * * *